United States Patent
Lin et al.

(10) Patent No.: US 11,602,047 B2
(45) Date of Patent: Mar. 7, 2023

(54) CIRCUIT BOARD TAPE AND JOINING METHOD THEREOF

(71) Applicant: CHIPBOND TECHNOLOGY CORPORATION, Hsinchu (TW)

(72) Inventors: Yin-Chen Lin, Miaoli County (TW); Ming-Hsiao Ke, Hsinchu (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/380,121

(22) Filed: Jul. 20, 2021

(65) Prior Publication Data

US 2022/0087017 A1    Mar. 17, 2022

(30) Foreign Application Priority Data

Sep. 11, 2020   (TW) .................................. 109131421

(51) Int. Cl.
   *H05K 1/03*      (2006.01)
   *H05K 13/02*    (2006.01)
   *H05K 13/04*    (2006.01)

(52) U.S. Cl.
   CPC ....... *H05K 1/0393* (2013.01); *H05K 13/0215* (2018.08); *H05K 13/0419* (2018.08)

(58) Field of Classification Search
   CPC .................... H05K 13/0419; H05K 13/0215
   (Continued)

(56) References Cited

U.S. PATENT DOCUMENTS

2001/0039076 A1*  11/2001  Hashimoto .......... H01L 23/544
                                                                257/E23.179
2019/0164877 A1    5/2019  Cho et al.

FOREIGN PATENT DOCUMENTS

JP          5-85044 U       11/1993
JP       2000-106387 A       4/2000
(Continued)

OTHER PUBLICATIONS

Taiwan Notice of Allowance dated Apr. 28, 2021 for Taiwanese Patent Application No. 109131421, 3 pages.
(Continued)

*Primary Examiner* — Peter Dungba Vo
*Assistant Examiner* — Azm A Parvez
(74) *Attorney, Agent, or Firm* — Demian K. Jackson; Jackson IPG PLLC (57) ABSTRACT

A circuit board tape includes substrate units each including a sprocket-hole region, a layout region and a joining mark. There are odd and more than three sprocket holes on the sprocket-hole region. An imaginary line extended from the joining mark is extended to between a first layout and a second layout located on the layout region. The amount of the sprocket holes between the imaginary lines of the adjacent substrate units is odd. The circuit board tape is cut along the imaginary lines of the different substrate units so as to remove the defective substrate unit from the circuit board tape and divide the circuit board tape into a front tape and a rear tape. After joining the front and rear tapes, the region where a first layout on the front tape and a second layout on the rear tape are located is defined as a combined layout region.

8 Claims, 10 Drawing Sheets

(58) Field of Classification Search
USPC .................................................. 29/739, 740
See application file for complete search history.

(56) References Cited

FOREIGN PATENT DOCUMENTS

| JP | 2001298056 A | * | 10/2001 | ............. H01L 24/50 |
|----|--------------|---|---------|--------------------------|
| JP | 2008-91435 A |   | 4/2008  |                          |
| JP | 2012-242778 A |  | 12/2012 |                          |
| KR | 10-2000-0012108 A | | 2/2000 |                         |
| TW | 201810828 A  |   | 3/2018  |                          |
| TW | 202010703 A  |   | 3/2020  |                          |

OTHER PUBLICATIONS

Japanese Office Action dated Jul. 27, 2022 for Japanese Patent Application No. 2021-119736, 4 pages.
Korean Office Action dated Oct. 31, 2022 for Korean Patent Application No. 10-2021-0094809, 4 pages.

* cited by examiner

CIRCUIT BOARD TAPE AND JOINING METHOD THEREOF

FIELD OF THE INVENTION

This invention relates to a circuit board tape, and more particularly to a circuit board tape able to be joined via a joining method after cutting a defective portion of the circuit board tape.

BACKGROUND OF THE INVENTION

There are multiple layouts arranged on a conventional circuit board tape and sprocket holes arranged at two sides of the conventional circuit board tape. Even sprocket holes are located at both sides of each of the layouts, respectively, and the distance between the adjacent sprocket holes is designed to match the tooth pitch of a transmission element (e.g. gear wheel or gear rack) such that the circuit board tape can be moved by the transmission element for the following processes such as chip bonding or molding.

The region where the defective layout is located is cut during inspection so the circuit board tape is divided into a front tape and a rear tape. And then the front and rear tapes are joined together for the following processed. However, due to the cut region is unpredictable and dependent on the location of the defective layout, the distance between the sprocket holes on the front and rear tapes may be different to that between other sprocket holes and the joined tape may be separated from the transmission element as the joined tape is moved by the transmission element.

SUMMARY

One object of the present invention is to provide a circuit board tape having equidistantly arranged sprocket holes after been cut and joined so as to solve the issue of different distance between the sprocket holes of the joined tape.

A circuit board tape of the present invention includes a plurality of substrate units arranged along a moving direction. Each of the substrate units includes a first sprocket-hole region, a second sprocket-hole region, a layout region and a joining mark. There are odd and more than three first sprocket holes on the first sprocket-hole region, and the first sprocket holes are arranged on one side of each of the substrate units equidistantly along the moving direction. There are odd and more than three second sprocket holes on the second sprocket-hole region, and the second sprocket holes are arranged on the other side of each of the substrate units equidistantly along the moving direction and symmetrical to the first sprocket holes. The layout region is located between the first and second sprocket-hole regions, a first layout and a second layout are located on the layout region and able to be separated from the circuit board tape as a signal circuit board, respectively. The joining mark is provided to define an imaginary line, the imaginary line is extended from the joining mark and located between the first and second layouts. The amount of the first sprocket holes located between the adjacent imaginary lines of the substrate units is odd.

A joining method of the circuit board tape of the present invention includes the steps of providing a circuit board tape including a plurality of substrate units as mentioned above, a first layout and/or a second layout of each of the substrate units is provided with a reject mark as the first and/or second layout is defective; determining a cut portion according to two imaginary lines adjacent to the defective first layout and/or the defective second layout, the defective first layout and/or the defective second layout is located on the cut portion; removing the cut portion by cutting the circuit board tape along the two imaginary lines which are configured to define the cut portion, the circuit board tape is divided into a front tape located and a rear tape, the front tape is located in the front of the cut portion and the rear tape is located behind the cut portion, wherein a first layout on a layout region and a first region of a first sprocket-hole region are located on a first joint end of the front tape, and a second layout on another layout region and a second region of another first sprocket-hole region are located on a second joint end of the rear tape; and joining the front and rear tapes, a first joint edge of the first joint end of the front tape is joined to a second joint edge of the second joint end of the rear tape such that the region where the first layout on the first joint end and the second layout on the second joint end are located is defined as a combined layout region, and the first region on the first joint end and the second region on the second joint end are defined as a combined first sprocket-hole region, wherein the amount of the first sprocket holes equidistantly arranged on the combined first sprocket-hole region is odd and the same as that on the first sprocket-hole region of each of the substrate units.

Each of the substrate units of the present invention has odd and more than three sprocket holes equidistantly arranged at two sides of the first and second layouts such that the circuit board tape of the present invention includes more layouts than conventional circuit board tape having the same length. Furthermore, two imaginary lines adjacent to the defective first layout and/or the defective second layout are provided to define the cut portion so the amount of the sprocket holes on the combined first sprocket-hole region formed after removing the cut portion and joining the front and rear tapes is identical to the amount of the sprocket holes on the first sprocket-hole region of each of the substrate units, both are odd and arranged equidistantly. The distance between the sprocket holes after tape joining is not changed so as to solve the problem of variation of distance between the sprocket holes on the conventional joined tape caused by the unpredictable cutting region.

DETAILED DESCRIPTION OF THE INVENTION

Figure 1:
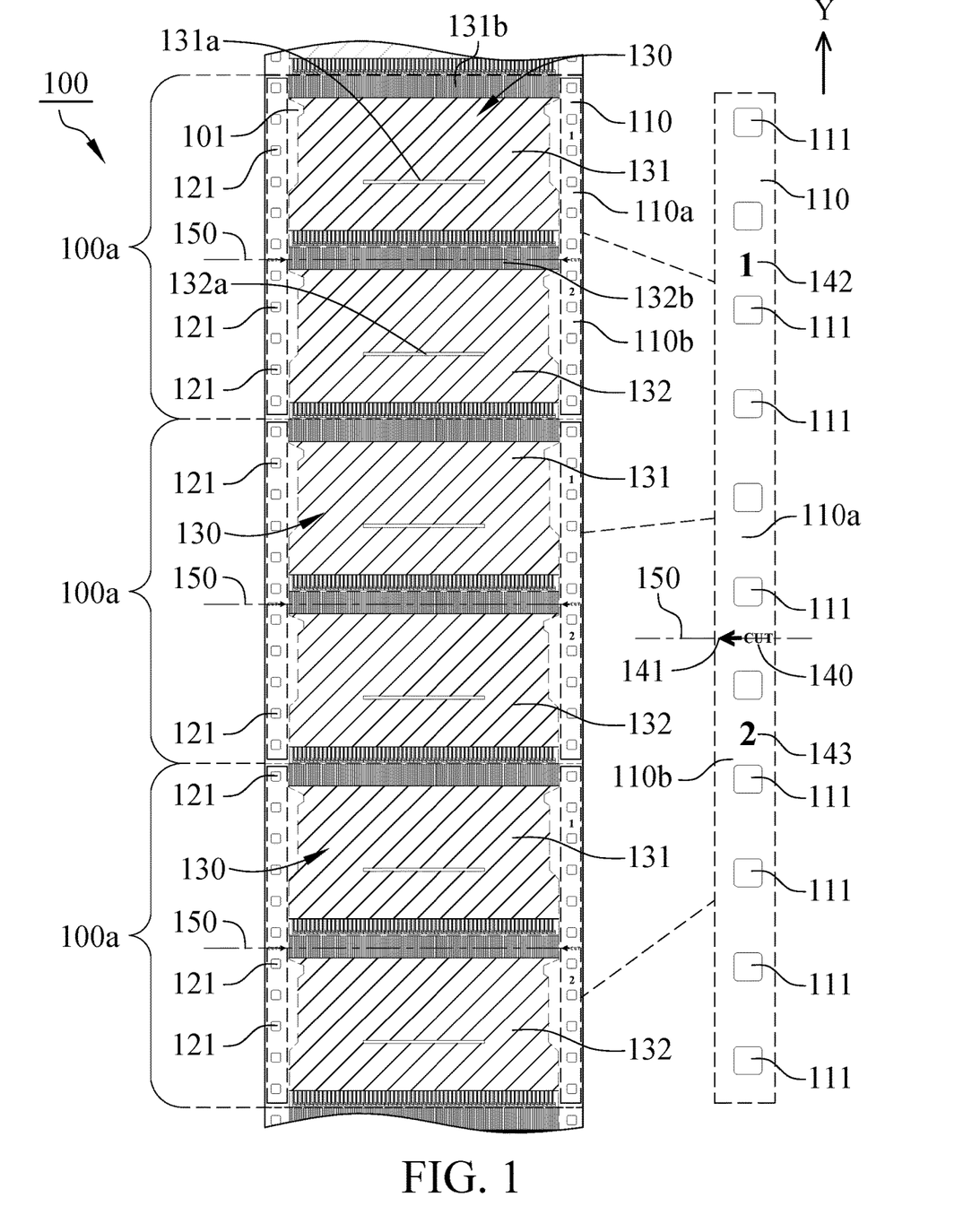
FIG. 1 is a top view diagram illustrating a circuit board tape in accordance with one embodiment of the present invention.
Figure 2:
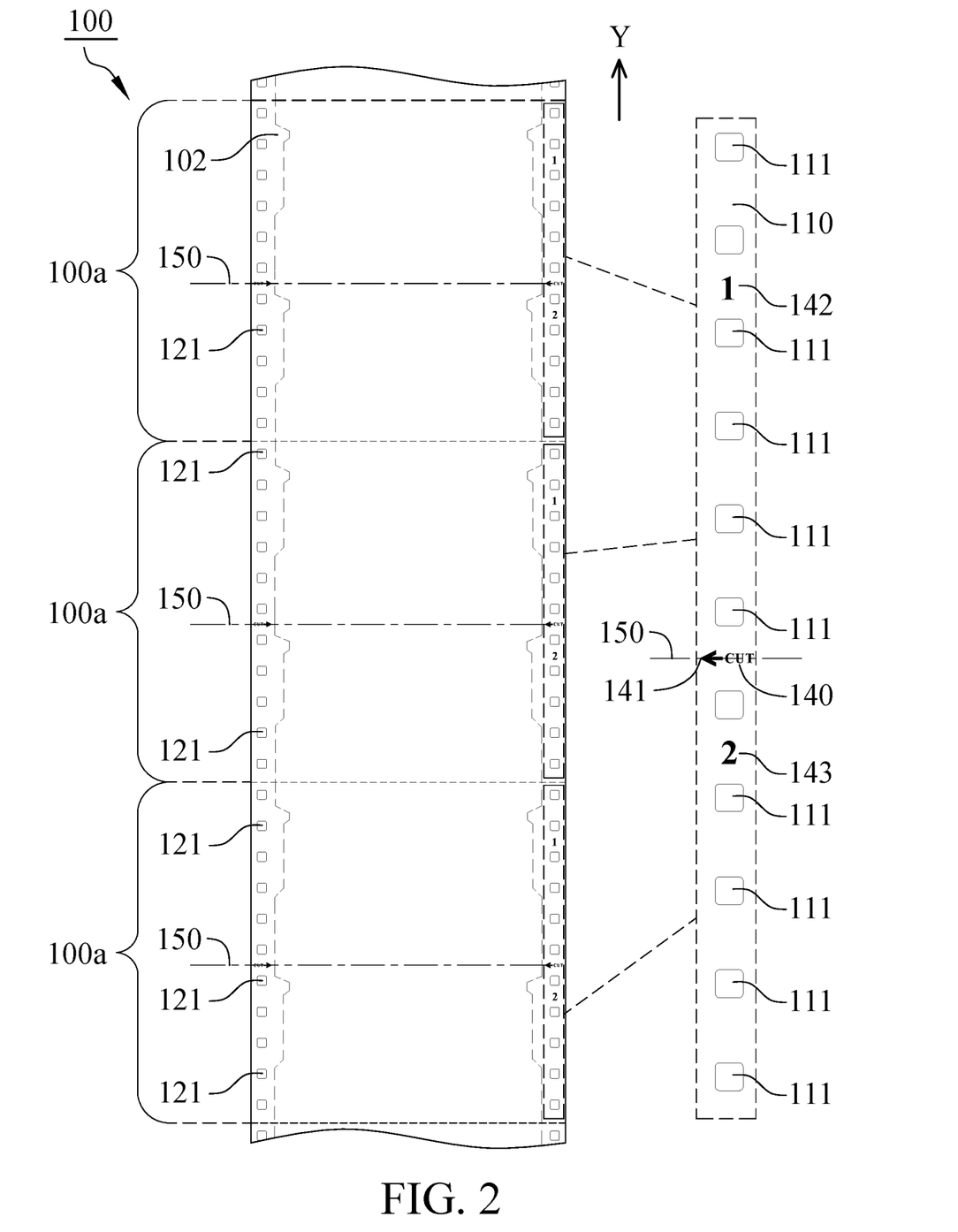
FIG. 2 is a bottom view diagram illustrating a circuit board tape in accordance with one embodiment of the present invention.

With reference to FIGS. 1 and 2, a circuit board tape 100 of the present invention includes a plurality of substrate units 100a arranged along a moving direction Y of the circuit board tape 100. Each of the substrate units 100a includes a first sprocket-hole region 110, a second sprocket-hole region 120, a layout region 130 and at least one joining mark 140. Odd and more than three first sprocket holes 111 are located on the first sprocket-hole region 110 and arranged on one side of each of the substrate units 100a equidistantly. As shown in partial enlarged diagrams of FIGS. 1 and 2, there are eleven first sprocket holes 111 located on the first sprocket-hole region 110 of this embodiment.

With reference to FIGS. 1 and 2, odd and more than three second sprocket holes 121 are located on the second sprocket-hole region 120 and arranged on the other side of each of the substrate units 100a equidistantly. Along the moving direction Y, the first sprocket holes 111 and the second sprocket holes 121 are symmetrical and corresponding to each other.

With reference to FIG. 1, the layout region 130 is located between the first sprocket-hole region 110 and the second sprocket-hole region 120, and there is a first layout 131 and a second layout 132 located on the layout region 130. In this embodiment, the first layout 131 and the second layout 132 having the same pattern are arranged on a first surface 101 of the circuit board tape 100 one by one. After the processed of chip bonding and molding, the first layout 131 and the second layout 132 can be separated from the circuit board tape 100 individually to become circuit boards. The first layout 131 includes a plurality of outer leads 131b located outside a chip-mounting area 131a along the moving direction Y, and the second layout 132 includes a plurality of outer leads 132b located outside another chip-mounting area 132a along the moving direction Y.

With reference to FIGS. 1 and 2, the joining mark 140 is located on one or both of the first surface 101 and a second surface 102 of the circuit board tape 100. In this embodiment, the joining mark 140 is located on the first sprocket-hole region 110 and between two of the adjacent first sprocket holes 111 and provided to define an imaginary line 150. The imaginary line 150 is extended from the joining mark 140 and located between the first layout 131 and the second layout 132. There are odd first sprocket holes 111 between two imaginary lines 150 of the adjacent substrate units 100a, and preferably, the amount of the first sprocket holes 111 located on the first sprocket-hole region 110 and that of the first sprocket holes 111 between the adjacent imaginary lines 150 are the same. The imaginary line 150 is provided to separate the first sprocket-hole region 110 into a first region 110a and a second region 110b which are located one side of the first layout 131 and the second layout 132, respectively. There are even first sprocket holes 111 on the first region 110a and odd first sprocket holes 111 on the second region 110b. The imaginary line 150 of this embodiment is designed to pass through the outer leads 132b of the second layout 132, but in another embodiment, the imaginary line 150 may be designed to be located between the outer leads 131b of the first layout 131 and the outer leads 132b of the second layout 132 and not pass through the outer leads 131b of the first layout 131 or the outer leads 132b of the second layout 132.

With reference to FIGS. 1 and 2, the joining mark 140 may be a geometric shaped mark, a number mark or a word mark. Preferably, the joining mark 140 is a geometric shaped mark having a corner point 141 toward the layout region 130, and the imaginary line 150 passes through the corner point 141.

With reference to FIGS. 1 and 2, each of the substrate units 100a preferably further includes a first order mark 142 and a second order mark 143 located on one or both of the first surface 101 and the second surface 102 of the circuit board tape 100. The first order mark 142 is located on one side of the first layout 131 and provided to denote the first layout 131, and the second order mark 142 is located on one side of the second layout 132 and provided to denote the second layout 132. Preferably, the first order mark 142 and the second order mark 143 are located on the first region 110a and the second region 110b, respectively. The first order mark 142 and the second order mark 143 may be geometric shaped marks, number marks or word marks. And the joining mark 140, the first order mark 142 and the second order mark 143 have different appearances (shape or profile).

A joining method of the circuit board tape 100 of the present invention as shown in FIGS. 1 to 7 includes the steps of providing the circuit board tape 100, determining a cut portion, removing the cut portion and joining remained tapes.

With reference to FIGS. 3A to 3D, after the inspection of the circuit board tape 100, the defective substrate unit(s) 100a is (are) marked using a reject mark A which may be a through hole or a colored mark.

Figure 3A:
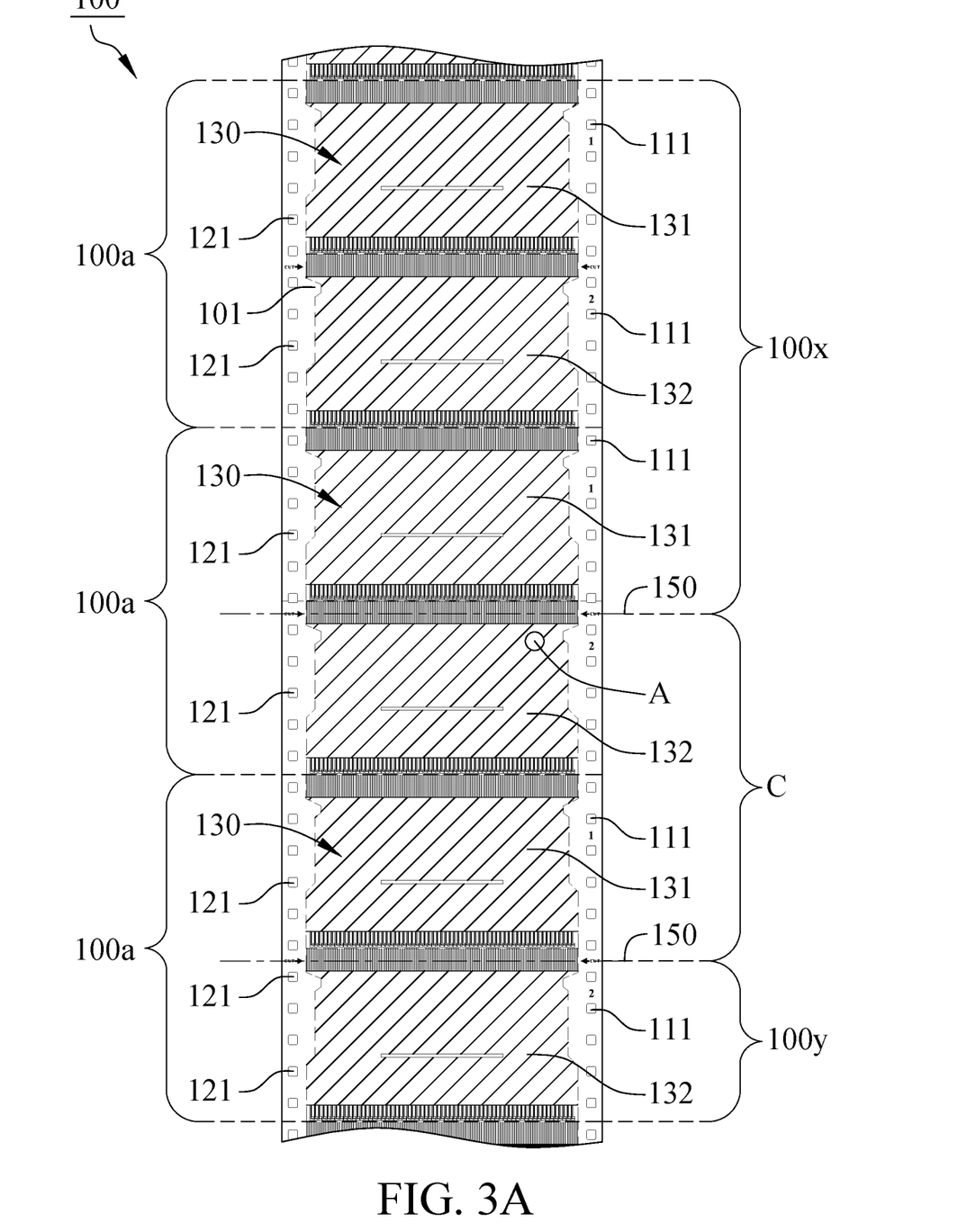
FIGS. 3A to 3D are top view diagrams illustrating a defective substrate unit in accordance with one embodiment of the present invention.

With reference to FIG. 3A, in one embodiment, a second layout 132 of one of the substrate units 100a of the circuit board tape 100 is considered as a defective layout after inspection, consequently, it is labeled with the reject mark A. Two imaginary lines 150 adjacent to the defective second layout 132 are used to define a cut portion C, a front tape 100x and a rear tape 100y. The defective second layout 132 is located on the cut portion C, the front tape 100x is located prior to the cut portion C and the rear tape 100y is located next to the cut portion C.

Figure 3B:
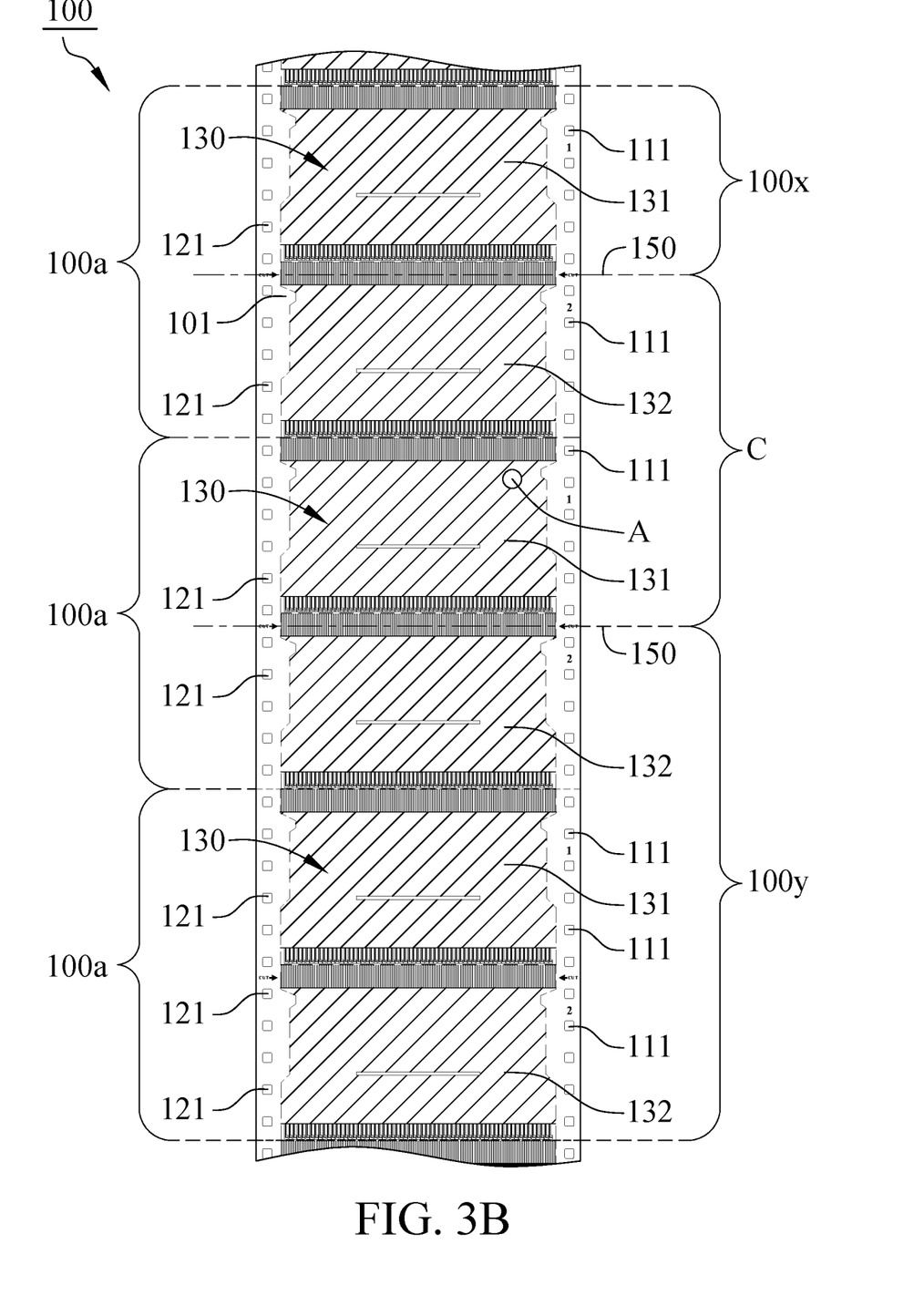

With reference to FIG. 3B, in another embodiment, a first layout 131 of one of the substrate units 100a of the circuit board tape 100 is considered as a defective layout such that it is marked with the reject mark A. Two imaginary lines 150 adjacent to the defective first layout 131 are provided to define the cut portion C, the front tape 100x and the rear tape 100y, and the cut portion C includes the defective first layout 131.

Figure 3C:
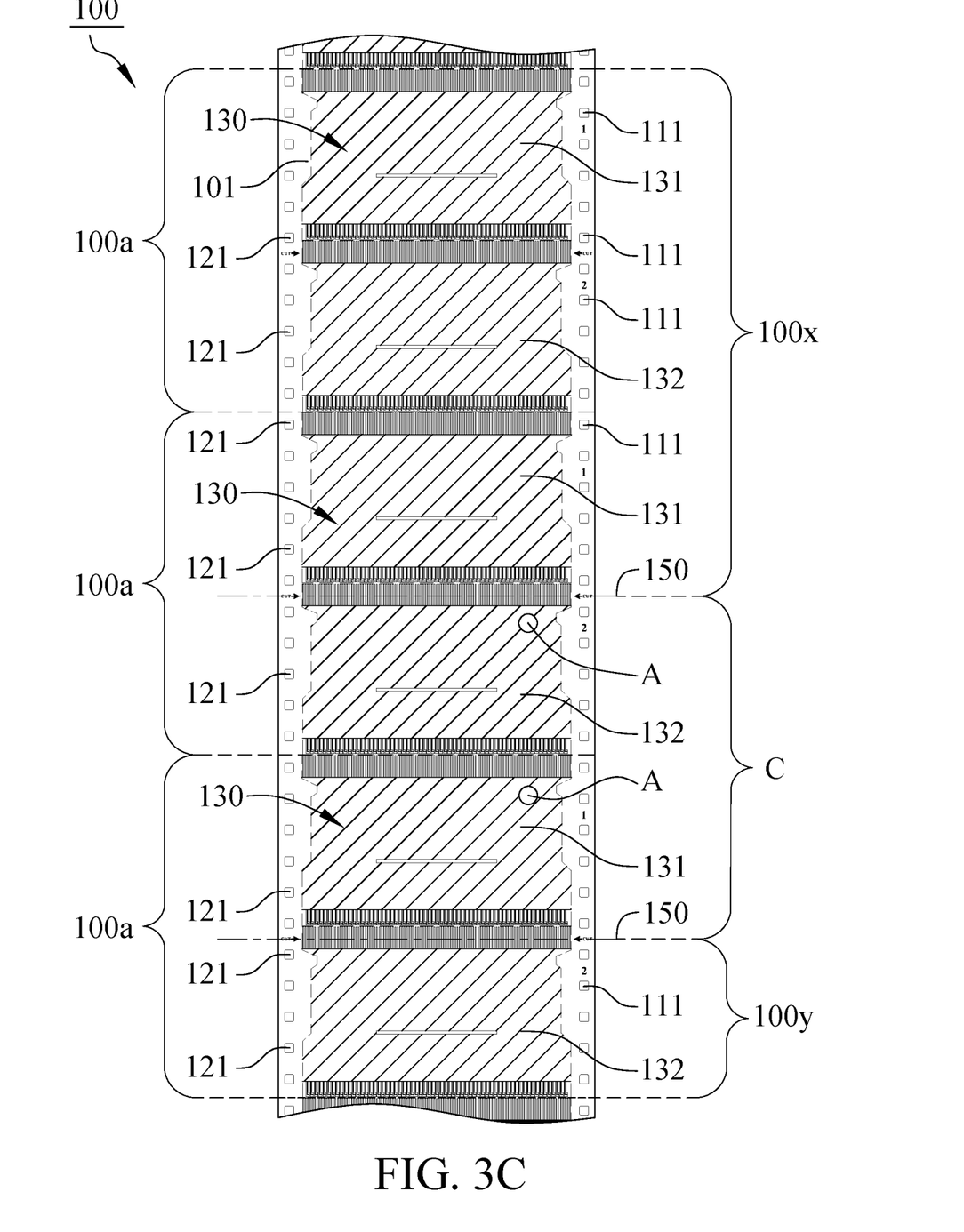

With reference to FIG. 3C, in another embodiment, a second layout 132 of one of the substrate units 100a and a first layout 131 of another one of the subject units 100a are considered as defective layouts and labeled with the reject mark A, respectively. The imaginary line 150 in the front of the defective second layout 132 and the imaginary line 150 behind the defective first layout 131 are provided to define the cut portion C, the front tape 100x and the rear tape 100y. The defective second layout 132 and the defective first layout 131 marked by the reject marks A are located on the cut portion C.

Figure 3D:
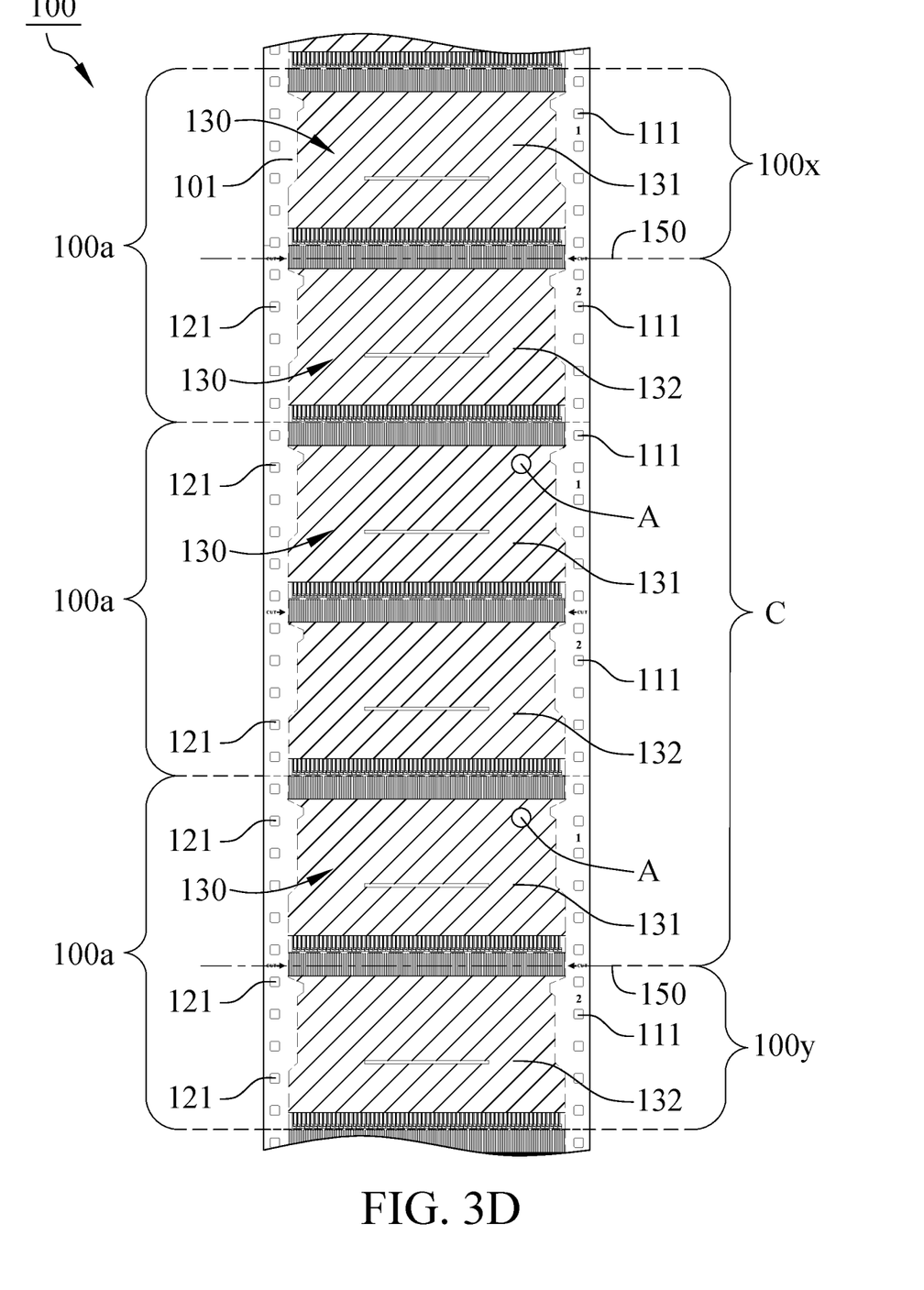

With reference to FIG. 3D, in another embodiment, a first layout 131 of one of the substrate units 100a and a first layout 131 of another one of the subject units 100a are considered as defective layouts and labeled with the reject marks A, respectively. The imaginary line 150 in the front of one of the defective first layout 131 and the imaginary line 150 behind the other one of the defective first layout 131 are provided to define the cut portion C, the front tape 100x and the rear tape 100y. The two defective first layouts 131 provided with reject marks A are located on the cut portion C.

With reference to FIGS. 3A to 3D and FIG. 4, the cut portion C is removed by cutting the circuit board tape 100 along the two imaginary lines 150 which are used to define the cut portion C such that the circuit board tape 100 is divided into the front tape 100x and the rear tape 100y. A first joint end 100b of the front tape 100x includes a first layout 131 located on a layout region 130 and a first region 110a of a first sprocket-hole region 110, and a second joint end 100c of the rear tape 100y includes a second layout 132 located on another layout region 130 and a second region 110b of another first sprocket-hole region 110.

Figure 4:
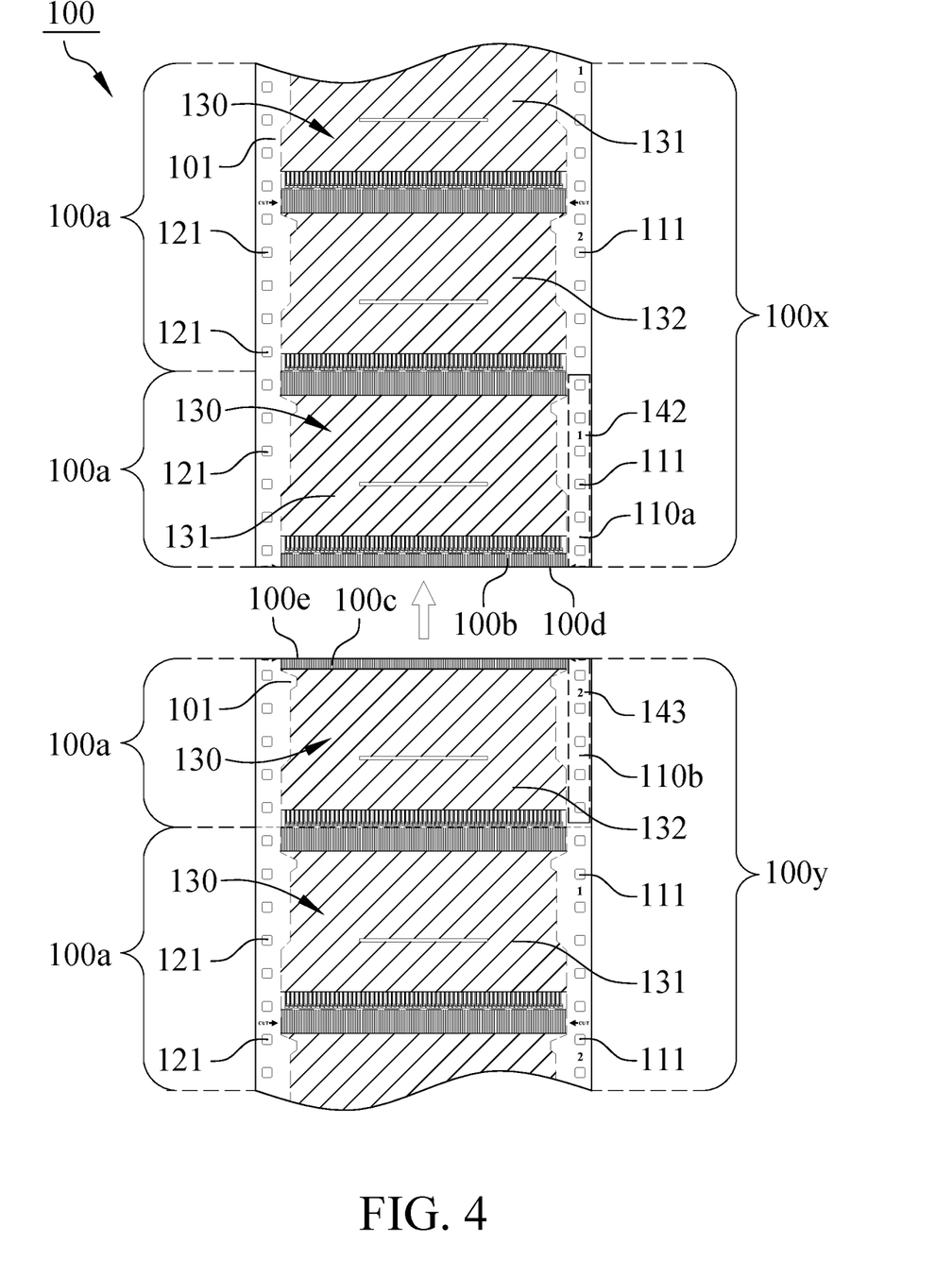
FIG. 4 is a top view diagram illustrating a circuit board tape after removing a cut portion in accordance with one embodiment of the present invention.
Figure 5:
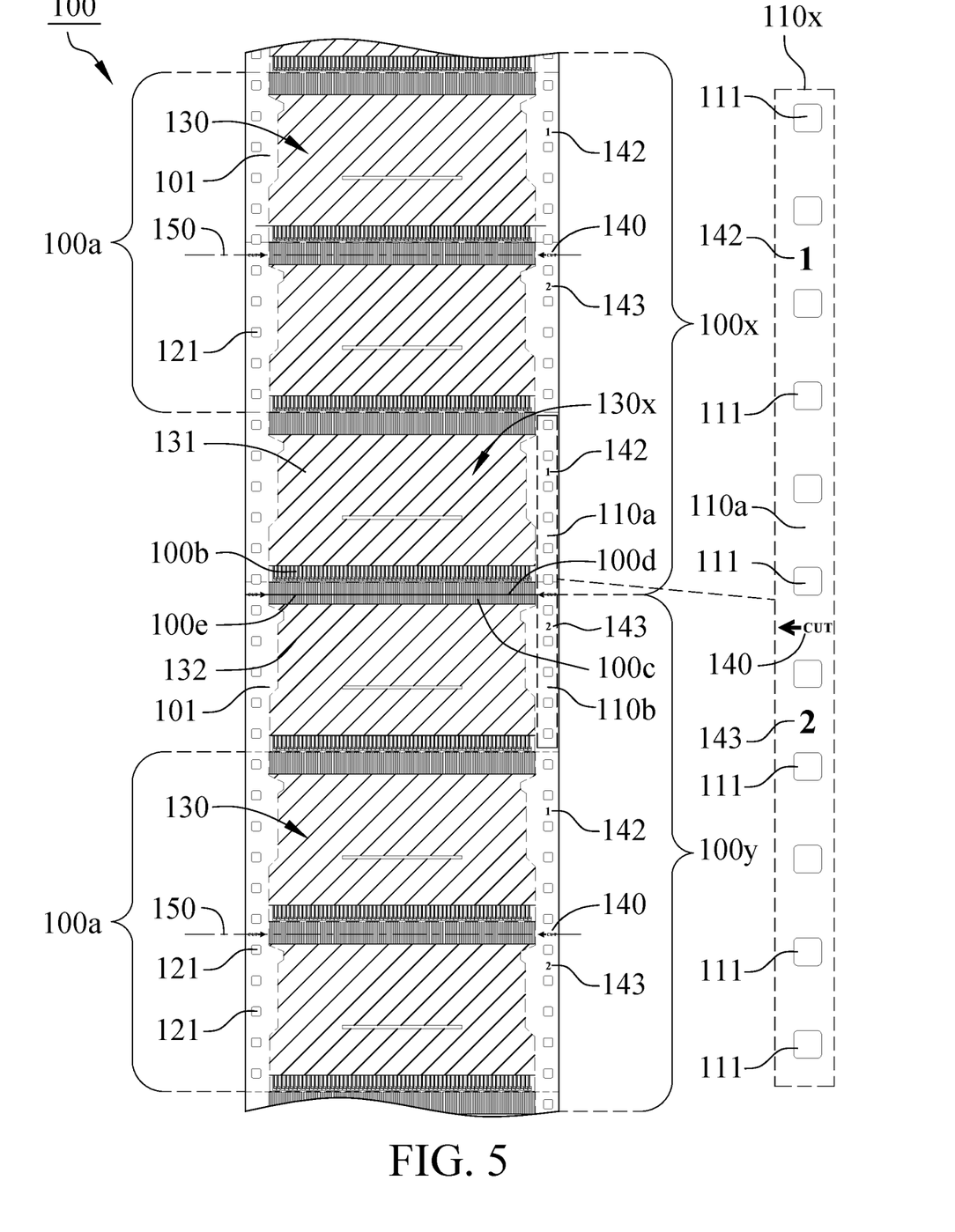
FIG. 5 is a top view diagram illustrating a circuit board tape after joining a front tape and a rear tape in accordance with one embodiment of the present invention.

With reference to FIGS. 4 and 5, the front tape 100x and the rear tape 100y are joined together by joining a first joint edge 100d of the first joint end 100b and a second joint edge 100e of the second joint end 100c. After joining the front tape 100x and the rear tape 100y, the region where the first layout 131 of the first joint end 100b and the second layout 132 of the second joint end 100c are located is defined as a combined layout region 130x, and the first region 110a on the first joint end 100b and the second region 110b on the second joint end 100c are combined as a combined first sprocket-hole region 110x. The first sprocket holes 111 on the combined first sprocket-hole region 110x are odd and arranged on one side of the combined layout region 130x equidistantly.

Figure 6:
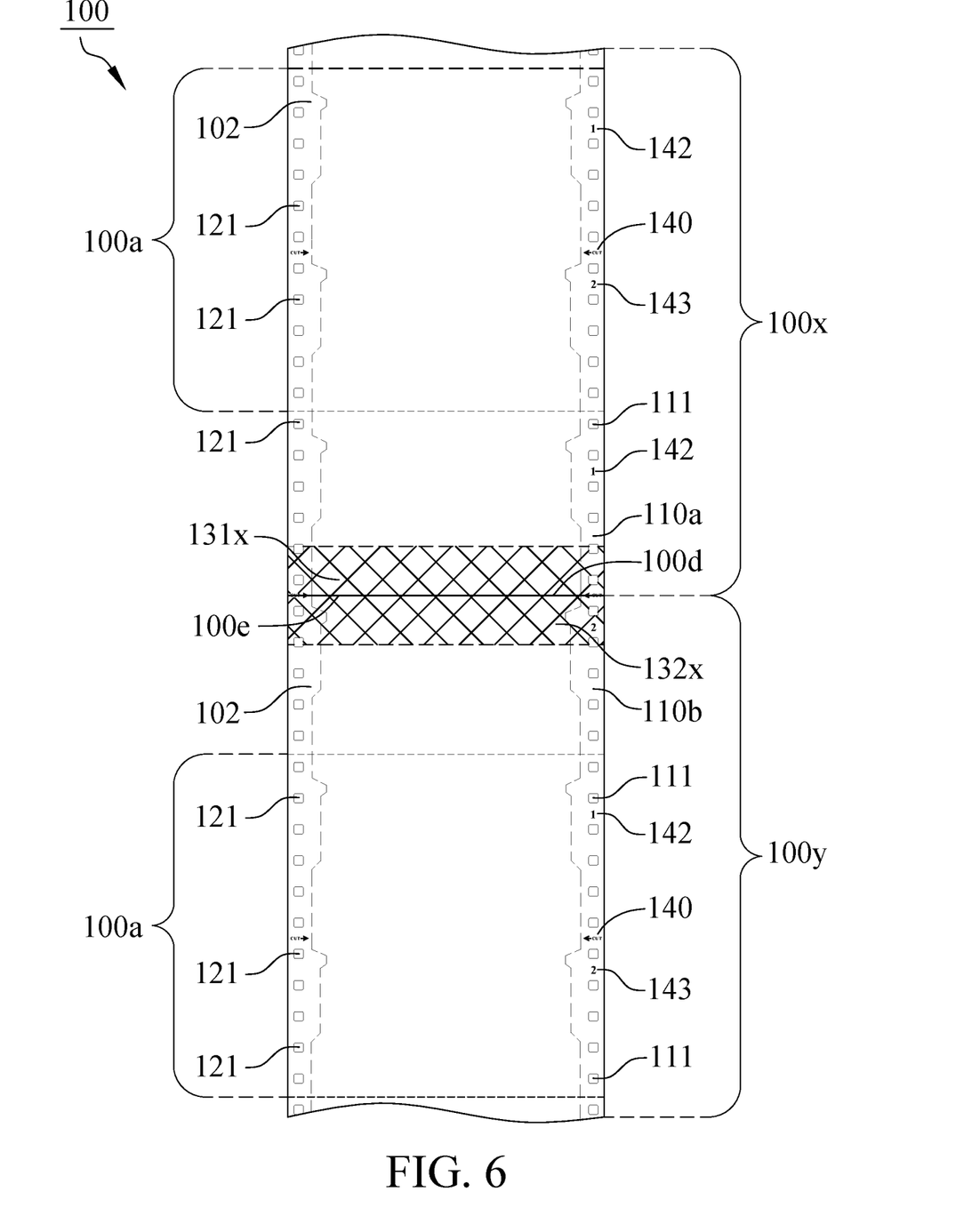
FIG. 6 is a bottom view diagram illustrating a circuit board tape after joining a front tape and a rear tape in accordance with one embodiment of the present invention.
Figure 7:
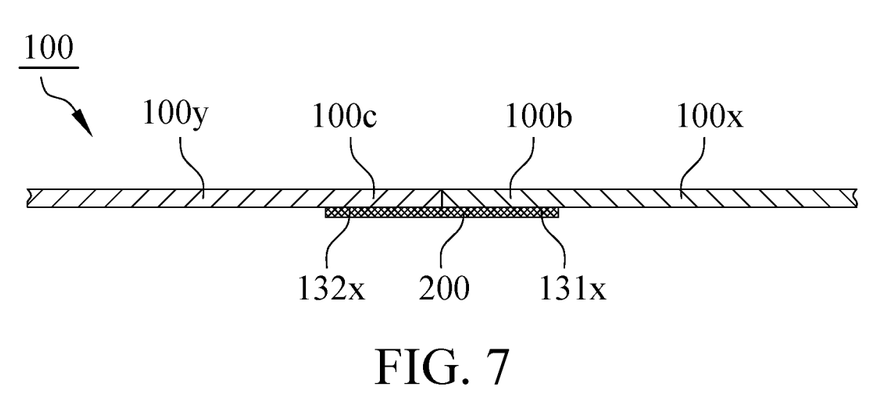
FIG. 7 is a cross-section view diagram illustrating a circuit board tape after joining a front tape and a rear tape in accordance with one embodiment of the present invention.

With reference to FIGS. 5 to 7, a joining element 200 is provided to join the first joint end 100b of the front tape 100x and the second joint end 100c of the rear tape 100y. In this embodiment, a first joining region 131x on the second surface 102 of the circuit board tape 100 is defined by the profile of the first layout 131 on the first joint end 100b, and a second joining region 132x on the second surface 102 is defined by the profile of the second layout 132 on the second joint end 100c. The joining element 200 is adhered to the first joining region 131x and the second joining region 132x to join the front tape 100x and the rear tape 100y together.

Because the first sprocket holes 111 and the second sprocket holes 121 on each of the substrate units 100a are odd and more than three, the distance between the sprocket holes on the front tape 100x and the rear tape 100y after joining is not changed. For this reason, there are more layouts on the circuit board tape 100 of the present invention than the conventional circuit board tape of the same length.

Moreover, because of the joining mark 140 on each of the substrate units 100a, the cut portion C can be determined by using two imaginary lines 150 close to the defective first layout 131 and/or the defective second layout 132. After tape joining, the layouts on the combined layout region 130x have the same pattern as the first layout 131 and the second layout 132 on each of the substrate units 100a, and the first sprocket holes 111 on the combined first sprocket-hole region 110x are arranged equidistantly and have the same number as the first sprocket holes 111 on the first sprocket-hole region 110 of each of the substrate units 100a. The present invention is provided to solve the problem that the distance difference of the sprocket holes after tape joining due to the cutting region is unpredictable and dependent on the location of defective layout(s).

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board tape comprising a plurality of substrate units arranged along a moving direction, each of the plurality of substrate units comprising:
    a first sprocket-hole region where a plurality of first sprocket holes are located, an amount of the plurality of first sprocket holes are odd and more than three, and the plurality of first sprocket holes are arranged on one side of each of the plurality of substrate units equidistantly along the moving direction;
    a second sprocket-hole region where a plurality of second sprocket holes are located, the amount of the plurality of second sprocket holes are odd and more than three, the plurality of second sprocket holes are arranged on the other side of each of the plurality of substrate units equidistantly along the moving direction and symmetrical to the plurality of first sprocket holes;
    a layout region located between the first and second sprocket-hole regions, a first layout and a second layout are located on the layout region and configured to be separated from the circuit board tape as a single circuit board, respectively; and
    a joining mark configured to define an imaginary line which is extended from the joining mark to be located between the first and second layouts, wherein the amount of the plurality of first sprocket holes located between the adjacent imaginary lines of the plurality of the substrate units is odd,
    wherein the first sprocket-hole region is separated into a first region and a second region according to the imaginary line, the first region is located on one side of the first layout and the second region is located on one side of the second layout, the amount of the plurality of first sprocket holes located on the first region is even and the amount of the plurality of first sprocket holes located on the second region is odd.

2. The circuit board tape in accordance with claim 1, wherein the amount of the plurality of first sprocket holes located between the adjacent imaginary lines is the same as that located on the first sprocket-hole region.

3. The circuit board tape in accordance with claim 1, wherein the joining mark is located on the first sprocket-hole region and between two of the adjacent first sprocket holes.

4. The circuit board tape in accordance with claim 3, wherein the imaginary line is configured to pass through a plurality of outer leads of the second layout.

5. The circuit board tape in accordance with claim 3, wherein the imaginary line is located between a plurality of outer leads of the first layout and a plurality of outer leads of the second layout and does not pass through the plurality of outer leads of the first layout or the plurality of outer leads of the second layout.

6. The circuit board tape in accordance with claim 1, wherein the joining mark is a geometric shaped mark, a number mark or a word mark, the geometric shaped mark has a corner point toward the layout region, and the imaginary line is configured to pass through the corner point.

7. The circuit board tape in accordance with claim 1, wherein each of the plurality of substrate units further includes a first order mark and a second order mark, the first order mark is located on one side of the first layout and configured to denote the first layout, the second order mark is located on one side of the second layout and configured to denote the second layout, the first and second order marks are geometric shaped marks, number marks or word marks, and the joining mark, the first order mark and the second order mark have difference appearances.

8. The circuit board tape in accordance with claim 7, wherein the first order mark is located on the first region, and the second order mark is located on the second region.

\* \* \* \* \*